United States Patent [19]

Remy

[11] 4,331,932
[45] May 25, 1982

[54] FREQUENCY SYNTHESIZER HAVING A VERY HIGH SPECTRAL PURITY

[75] Inventor: Joël Rémy, Paris, France

[73] Assignee: Adret Electronique, France

[21] Appl. No.: 161,260

[22] Filed: Jun. 20, 1980

Related U.S. Application Data

[63] Continuation-in-part of Ser. No. 913,726, Jun. 7, 1978.

[30] Foreign Application Priority Data

Jun. 17, 1977 [FR] France ................................ 77 19353

[51] Int. Cl.³ .............................................. H03L 7/20
[52] U.S. Cl. ........................................ 331/2; 331/19; 331/25
[58] Field of Search .................... 331/2, 18, 19, 25, 23, 331/37–39, 41; 332/22

[56] References Cited

U.S. PATENT DOCUMENTS

| | | | |
|---|---|---|---|
| 3,202,930 | 8/1965 | Muraszko | 331/2 |
| 3,427,561 | 2/1969 | Hamer | 331/19 |
| 3,569,838 | 3/1971 | Blair et al. | 331/2 X |
| 3,694,766 | 9/1972 | Boelke | 331/19 X |

*Primary Examiner*—Siegfried H. Grimm
*Assistant Examiner*—Edward P. Westin
*Attorney, Agent, or Firm*—William A. Drucker

[57] ABSTRACT

Synthesizer including a VCO-type oscillator covering the range from 300 to 610 MHz and driving a first mixer; a source of 80 MHz standard frequency, followed by a frequency multiplier and a tunable filter driving the first mixer; a second, sampling-type mixer driven on the one hand by the output of the first mixer and on the other hand by the standard frequency divided in a divider by 8. The output from the second mixer controls the frequency of the oscillator.

Application to the production of a synthesizer with very high spectral purity.

5 Claims, 5 Drawing Figures

FREQUENCY SYNTHESIZER HAVING A VERY HIGH SPECTRAL PURITY

This application is a continuation-in-part of application Ser. No. 913,726 filed June 7, 1978.

BACKGROUND OF THE INVENTION

In some fields of application, frequency synthesizers are not known for quality of their spectrum, especially as regards the spectral noise components situated more than a few kHz from the carrier.

Because of this, they are barred from a certain number of applications, such as measurement of the signal/-noise ratio on receivers, the control of UHF transmitters and the use of the synthesizer as a local oscillator for a spectrum analyser with a high dynamic characteristic.

It would be desirable, for such applications, to be able to make a synthesizer covering a range of high frequencies going up to several hundred MHz with a noise level, at 12.5 kHz from the carrier, equal to $-140$ db/Hz at the most.

Now the synthesis of high frequencies is generally effected by comparison of the frequency of an harmonic component having a standard frequency of the order of 10 MHz with the output frequency of a voltage-controlled oscillator (VCO), and by tuning the latter. While it is known how to make a crystal master oscillator which generates the standard frequency with the desired spectral purity, multiplication of this standard frequency by factors of several tens multiplies the noise in the same ratio and makes it quite incompatible with the application envisaged.

SUMMARY OF THE INVENTION

The present invention solves this problem by means of a synthesizing device mainly characterized in that it uses the multiplication of the standard frequency by a factor equal to ten at the most; the mixing, in a sampler, of the beat obtained between the output frequency of the oscillator and the harmonic component of the standard frequency resulting from said multiplication, with a frequency obtained by dividing said standard frequency by a whole number lower than 10.

According to a preferred form of embodiment, the standard frequency is taken equal to 80 MHz and the division factor is taken equal to 8.

Under these conditions, the device will cover an octave starting from a frequency of the order of 300 MHz, with standard frequency multiplication factors not exceeding 7 or 8, and, consequently, not leading to any considerable multiplication of the master oscillator's own noise, and the sampler will operate on an harmonic component equal in rank to 5 at most of the frequency of 10 MHz resulting from the division, therefore it will not introduce any considerable noise.

Such a synthesizing circuit makes it possible to vary the output frequency in steps of 10 MHz.

According to an important feature of the invention, when, on basis of such a circuit, it is wished to obtain a generator which can be frequency-modulated, a synthesizing circuit in 1 kHz steps made in accordance with U.S. Pat. No. 4,186,356 filed on Apr. 18th, 1978 in the name of Joël Remy for "Phase locked loop frequency synthesizer and frequency modulator", is associated with the synthesizing circuit in 10 MHz steps defined above.

Such a circuit includes a main frequency-modulated oscillator and a voltage-controlled auxiliary oscillator, each controlled by a phase-locking loop and is characterized in that the control loop of each of these two oscillators has its origin at the output of the other oscillator (such a circuit arrangement will be termed an "overlapping loop circuit"). The mixer of the loop which controls the auxiliary oscillator receives an intermediate frequency.

It constitutes the only known way of obtaining a frequency-modulated synthesizer having high resolution and in which the noise which affects the auxiliary oscillator and the intermediate frequency is filtered by the pass-band of the main oscillator's control loop.

By virtue of the peculiarities listed above, taken together, the invention makes it possible to obtain a frequency synthesizer having, in addition to the advantages inherent in any synthesizer (high stability, programming possibility) a spectral purity comparable to that of generators which use a pot oscillator with very high Q factor.

DESCRIPTION OF THE DRAWINGS

A better understanding of the invention will be obtained from the following description.

In the attached drawings.

DESCRIPTION OF THE PREFERRED EMBODIMENT

Figure 1:
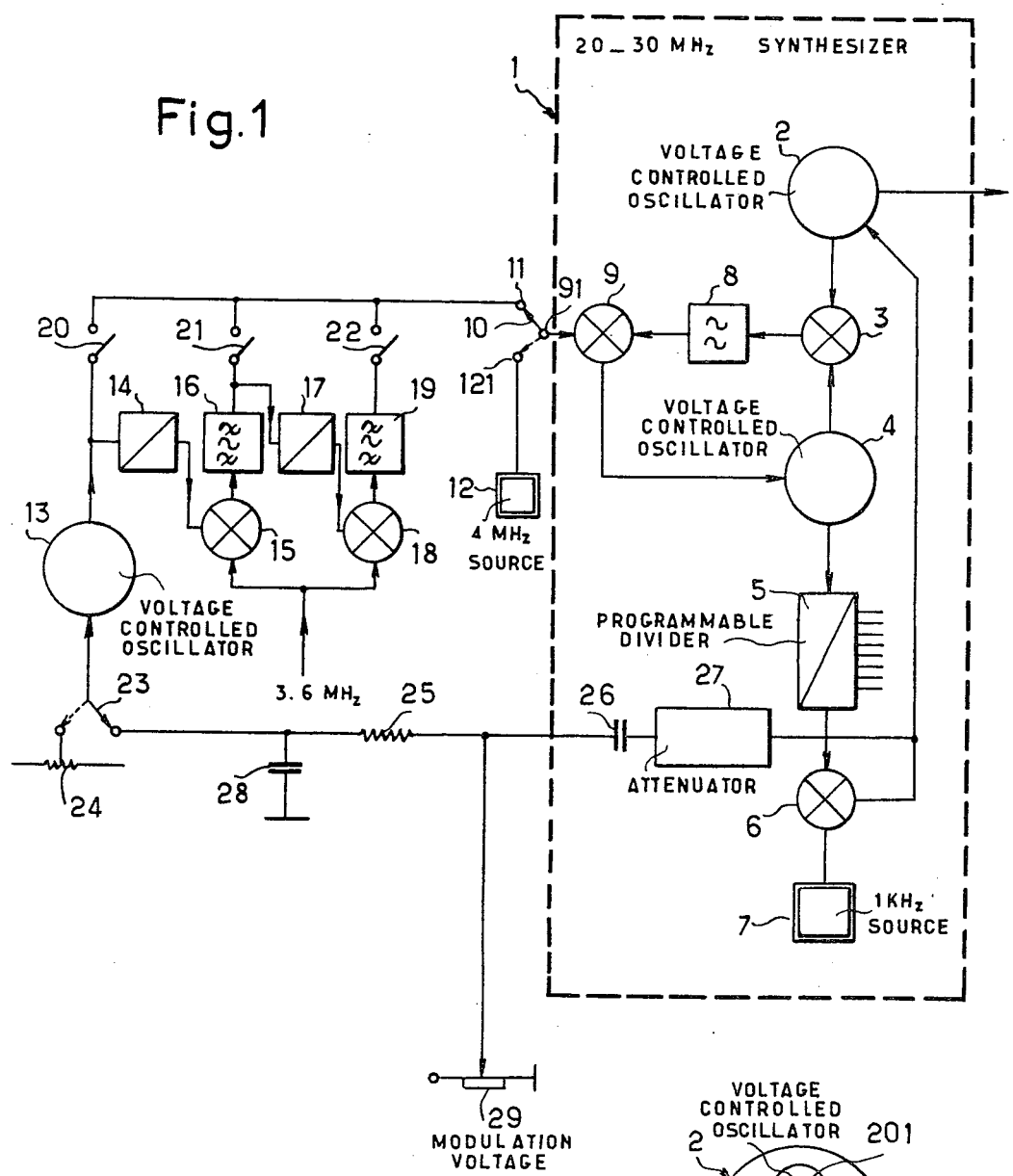
FIG. 1 shows a preferred form of embodiment of a synthesizing circuit in 1 kHz steps associated with an interpolation circuit.
Figure 3:
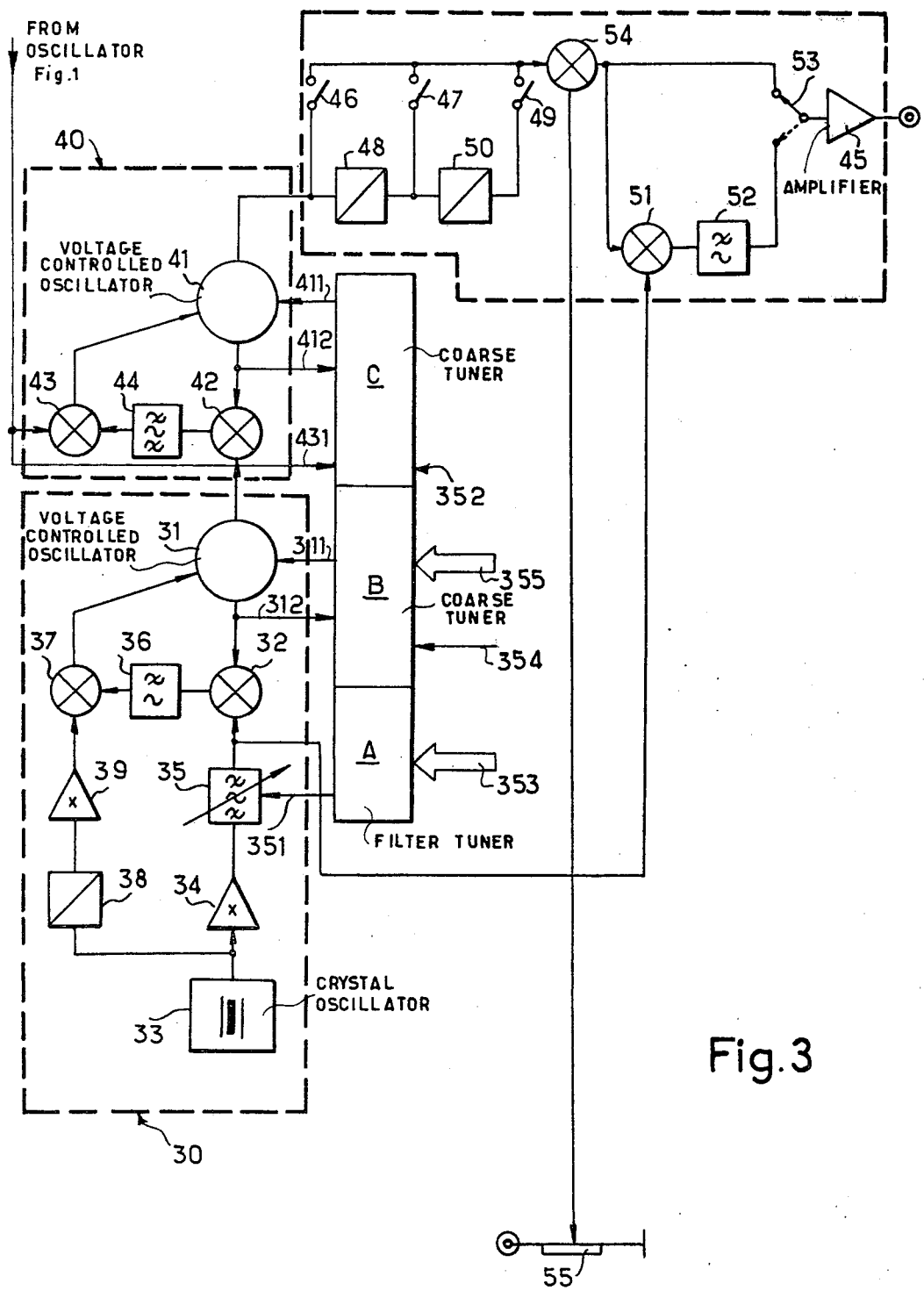
FIG. 3 shows a preferred form of embodiment of a synthesizing circuit in 10 MHz steps, a circuit inserting the 1 kHz steps and a circuit defining the output subranges of a synthesizing circuit.

The synthesizing circuit illustrated in FIGS. 1 and 3 taken together is designed to cover the range from 300 kHz to 640 MHz in steps of 1 kHz, with frequency modulation (including transmission of the D.C. component) and amplitude modulation functions.

FIG. 1 shows, inside a rectangle 1, a synthesizing device with a frequency comprised between 20 and 30 MHz in steps of 1 kHz. This device is of the type described in the above-mentioned copending patent application.

It includes a voltage-controlled oscillator 2 covering the range from 20 to 30 MHz, followed by a mixer 3. The latter is moreover driven by a voltage-controlled oscillator 4 covering the range from 10 to 26 MHz, itself followed by a programmable divider 5 whose division factor D may vary between 16,000 and 26,000. This divider drives a mixer 6, moreover driven by a standard frequency of 1 kHz supplied by a source 7. The output from mixer 6 controls the frequency of oscillator 2. The output from mixer 3, after passing through a pass-band filter 8 which only allows the subtractive beat to pass between the frequencies of oscillators 2 and 4, i.e. 4 MHz$\pm\Sigma$, $\Sigma$ being a small frequency value, drives a mixer 9, which moreover receives, at its terminal 91, a frequency of 4 MHz$\pm\Delta$, $\Delta$ being a frequency variation which will be defined hereafter. The output from mixer 9 controls the frequency of oscillator 4.

Instead of the variable frequency 4 MHz±Δ, terminal 91 may receive a standard frequency of 4 MHz. For this purpose, a change-over switch 10, instead of connecting terminal 91 to terminal 11 of the preceding circuit, connects terminal 91 to output terminal 121 of a source 12.

The circuit which precedes circuit 1 comprises a voltage-controlled oscillator 13 whose frequency is continuously variable in the range 4 MHz±0.3 MHz. It is followed by an increment divider made up as follows:

A first divider 14 of frequency by 10, connected to the output of oscillator 13, drives a mixer 15 which also receives a standard frequency of 3.6 MHz. The output from mixer 15, after filtering through a pass-band filter 16 which transmits the frequencies 4 MHz±30 kHz, drives a divider by ten 17, itself followed by a mixer 18 which also receives the standard frequency of 3.6 MHz. The output from mixer 18 is filtered through a pass-band filter 19 which transmits the frequencies 4 MHz±3 kHz.

The outputs from oscillator 13 and filters 16 and 19 are connected in parallel to terminal 11 via switches 20, 21, 22 respectively. The control input of oscillator 13 is connected, by means of a switch 23, either to a potentiometer 24 supplied by a source of D.C. current (not shown) or to a circuit modulating the frequency of oscillator 2. This modulation circuit includes a potentiometer 29 which receives the modulation voltage and transmits the A.C. component thereof to the control input of oscillator 2, via a capacitor 26 and an attenuator 27. The D.C. component of the modulation voltage is applied to oscillator 13 via a filter consisting of a capacitor 28 and a resistor 25.

When change-over switches 10 and 23 are in the positions shown in dotted lines, potentiometer 24 makes it possible to vary the frequency of oscillator 13 continuously in the range of 4 MHz±100 kHz, so that the frequency applied to terminal 91 varies in the range 4 MHz±1 kHz (only switch 22 being closed).

When change-over switches 10 and 23 are in the positions shown in solid lines, the D.C. component of the modulation frequency has the effect of varying the frequency of oscillator 13 in one of the three ranges 4 MHz±300 kHz; 4 MHz±30 kHz; 4 MHz±3 kHz, as a function of the control of switches 20, 21 and 22.

In fact, when switch 20 is closed, while 21 and 22 are open, this obviously gives Δ=300 kHz. When switch 21 only is closed, the additive beat which occurs in mixer 15 reconstitutes the frequency of 4 MHz, but the frequency variation ±0.3 kHz is divided by 10; therefore Δ=±30 kHz. Similarly, when switch 22 is the only one which is closed, the frequency variation is divided by 100; therefore Δ=±3 kHz.

The three frequency variation values so obtained correspond to the three current frequency variation values in frequency modulation.

To sum up, the circuit which has just been described and which is also disclosed in the above-mentioned copending patent application, allows the transmission of the D.C. component in frequency modulation and the fulfilment of the interpolation function with a 4 MHz oscillator which is variable in the range 4 MHz±300 kHz, therefore easy to produce with good stability and satisfactory accuracy.

The input frequency of circuit 1 being 4 MHz±Δ, it is easy to see that the frequency of oscillator 2 is controlled by the value D×1 kHz+4 MHz±Δ.

As is explained in the above-mentioned patent application, the circuit contained in rectangle 1 practically preserves the intrinsic spectral purity of main oscillator 2. If very high spectral purity is wanted, e.g. of the order of magnitude indicated above, oscillator 2 must, in practice, be made up, as FIG. 2 indicates, of an oscillator 201 covering the range from 96 to 120 MHz, followed by a divider 202 whose factor can be commuted, by application of a logical level on to values 5 or 4. Synthesis of the range from 20 to 24 MHz is then effected by fixing the factor of divider 202 at the value of 5 and by programming the factor of divider 5 on the values from 16,000 to 20,000, while synthesis of the range from 24 to 30 MHz is effected by fixing the factor of divider 202 at the value of 4 and by programming the factor of divider 5 on the values 20,000 to 26,000. The result is that each of the two variable-capacity diodes which will be comprised in oscillator 201 will only have to cause a maximum relative frequency variation about half as large as if the circuit having reference numeral 1 in FIG. 1 were used. The effect of the parametric noise of this diode is reduced in the same proportion. This result can be further improved by associating with each of these two diodes, two different inductances, each covering half the range from 20–24 or 24–30 MHz.

FIG. 3 shows the synthesizing circuit in 10 MHz steps.

A first circuit, contained in a rectangle 30, includes a voltage-controlled variable oscillator 31 which, in the non-limiting example described, covers the range from 300 to 610 MHz. This is an ordinary circuit with a Q-factor of the order of, e.g., 20 to 30.

This oscillator drives a mixer 32, which also receives the harmonic components from an 80 MHz reference frequency supplied by a master crystal oscillator 33. These harmonic components are generated by a harmonic oscillator 34 and filtered by a filter 35. This filter can be tuned on frequencies of 320, 400, 480 and 560 MHz. For that purpose, at its input 351, it receives a code supplied by part A of a device 352. Part A is a switching circuit of a known type which, starting from a logical code, i.e., from digital information provided on input 353, generates, on output lead 351, a D.C. voltage adapted to tune filter 35 on a selected frequency. For that purpose, filter 36 is of the type including an oscillatory circuit, the tuning means of which include a plurality of variable-capacity diodes which are controlled by the said D.C. voltage. The switching circuit will for instance consist of a logical switch and of a plurality of potentiometers providing respective adjustable D.C. voltages. The logical switch will apply one or several of the said adjustable D.C. voltages on the variable-capacity diodes, as a function of the digital information applied at its inputs.

Via a low-pass filter 36 having a cut off frequency of 50 MHz, the output of mixer 32 drives a sampling-type mixer 37 whose output drives the frequency control element of oscillator 31. This element is, e.g., a variable-capacity diode.

Mixer 37 also receives the reference frequency, after division by eight in a fixed divider 38 and production of harmonic components in a harmonic generator 39. Mixer 32 is preferably the Schottky type, only introducing very low noise. The crystal master oscillator 33 has high spectral purity and, subject to using a type TTL or ECL logical divider 38, the noise from the latter is of the same order of magnitude as that from the master oscillator, so that the frequency of 10 MHz at the output of the divider has substantially the same spectral purity as the 80 MHz reference frequency. Now, as we shall see below, it is the spectral purity of these 10 MHz and 80 MHz frequencies which mainly determines the spectral purity of the frequency generated by oscillator 31.

The latter is fitted with a frequency control device or coarse tuner, which forms part B of block 352 and advantageously comprises a standard phase-control loop whose divider is programmable, and which provides, through lead 311, an appropriate control voltage to oscillator 31, whereby the latter will operate in a narrow band of frequencies about a predetermined controllable frequency.

Figure 4:
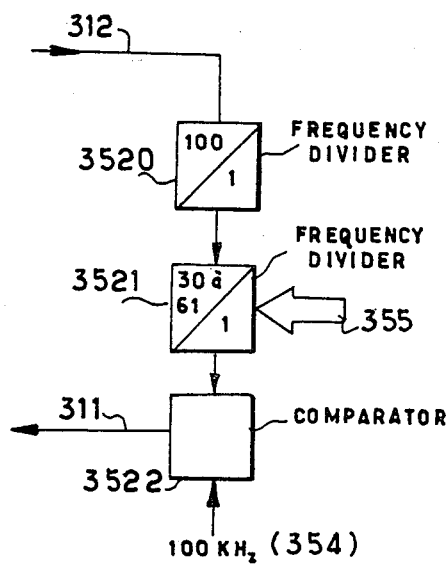
FIG. 4 shows a preferred embodiment of part B of block 352 illustrated in FIG. 3.

A preferred embodiment of part B is illustrated on FIG. 4. It comprises a first frequency divider 3520 having a fixed dividing ratio equal to 100, followed by a second frequency divider 3521 having a dividing ratio variable from 30 to 61 by integral values. A logical code, applied on lead 355, enables one to select the proper value of the dividing ratio of divider 3521. A logical frequency and phase comparator 3522 compares the output of divider 3521 with a standard frequency of 100 kHz applied on lead 354. The output of comparator 3522 is applied, through lead 31, to oscillator 31, whereas the input to divider 3520 is derived from the output of oscillator 31 through lead 312.

If it is desired, as explained hereinafter, the frequency of oscillator 31 be approximately 300 MHz, the logical code applied on lead 355 will be selected for providing a dividing ratio of 30 for divider 3521.

The frequency F of oscillator 31 will then be controlled by the output of comparator 3522, until one has approximately:

$$F/100 \times 30 = 100 \text{ kHz}$$

i.e. $F \neq 300$ MHz

The circuit which has just been described makes it possible to synthesize frequencies comprised between 300 and 610 MHz and separated by steps of 10 MHz. More precisely, these frequencies have the form:

$$F = (80 \times a) \text{ MHz} \pm (b \times 10) \text{ MHz}$$

with $a = 4, 5, 6$ or $7$ and $b = 0, 1, 2, 3, 4$ or $5$

Operation is as follows:

To synthesize 300 MHz, the divider 3521 of the control loop (352 B) is programmed, as explained hereinabove, so that oscillator 31 oscillates on a frequency close to 300 MHz and filter 35 is turned on 320 MHz. Mixer 32 transmits a subtractive beat close to 20 MHz which mixer 37 samples. It is the harmonic component 2 of the 10 MHz frequency which intervenes, which introduces into the control loop of oscillator 31 the noise belonging to the frequency of 10 MHz, multiplied by 2. Mixer 32 receives the harmonic component 4 of the reference frequency; in other words, the noise belonging to this frequency is multiplied by 4, which makes it possible to preserve very good spectral purity.

To synthesize 310 MHz, the divider of the control loop of oscillator 31 is programmed so that the latter oscillates on a frequency close to 310 MHz and filter 35 is tuned on 320 MHz. Mixer 37 then samples a beat of 10 MHz. The result is that the noise affecting the frequency of 10 MHz coming from divider 38 is not multiplied by mixer 37. As before, the noise belonging to the reference frequency is multiplied by 4.

Starting from the value of 370 MHz of the frequency to be synthesized, filter 35 is tuned on 400 MHz, so that the beat coming from mixer 32 is brought back to 30 MHz. This beat is therefore finally maximum for an output frequency equal to 360 MHz and then assumes the value 40 MHz. In this case, the noise which affects the frequency coming from divider 38 is multiplied by 4 in mixer 37 (which operates on harmonic component 4).

Starting from an output frequency equal to 450 MHz, filter 35 is tuned on 480 MHz; starting from an output frequency equal to 530 MHz, filter 35 is tuned on 560 MHz for an output frequency equal to 610 MHz, mixer 37 samples harmonic component 5 of the 10 MHz frequency.

It can be seen that the noise affecting the frequency coming from divider 38 is at the most multiplied by 5 in mixer 37, whereas the noise belonging to the reference frequency is multiplied at most by 8 in multiplier 34.

In the example in question, while the choice of the standard frequency leads to a maximum coefficient of multiplication of 8, experience has shown that it is possible to make harmonic generators having such a multiplication factor, with very small inherent noise and that it is also possible to make crystal oscillators whose inherent noise is such that its multiplication by 8 still leads to a spectral purity of the order of magnitude mentioned above.

A second circuit, of a type known in itself, contained in a rectangle 40, inserts the 1 kHz steps into the output frequency of oscillator 31, which is variable in steps of 10 MHz.

Figure 2:
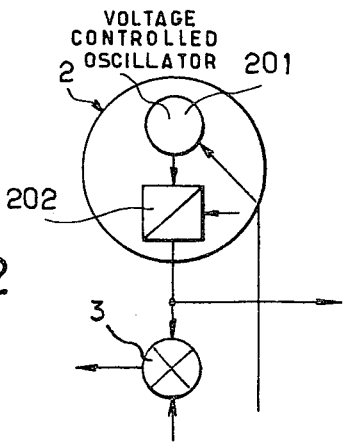
FIG. 2 shows a preferred variant of the main oscillator circuit comprised in the circuit of FIG. 1.

A voltage-controlled oscillator 41 covers the range from 320 to 640 MHz. The outputs of oscillators 31 and 41 drive a mixer 42, advantageously of the Schottky type, whose output drives a mixer 43 (advantageously of the same type) via a filter 44 which transmits the 20 to 30 MHz band. Mixer 43 receives the output frequency of oscillator 2 (FIG. 1) or divider 202 (FIG. 2). The coarse tuning of frequency of oscillator 41 is controlled by part C of block 352.

Figure 5:
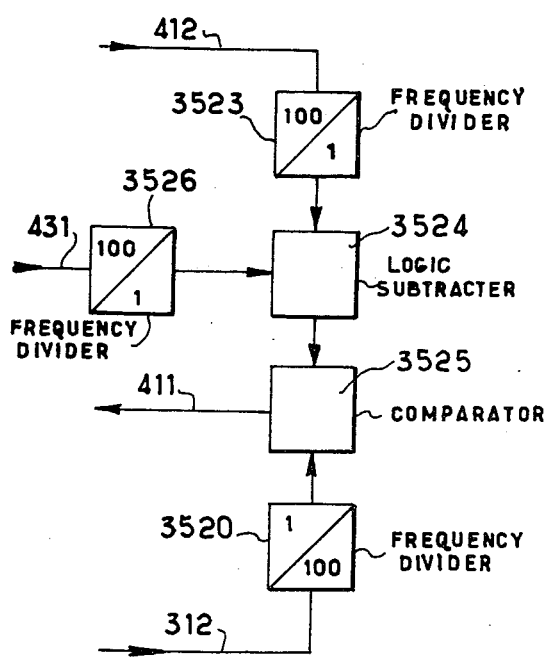
FIG. 5 shows a preferred embodiment of part C of block 352 illustrated in FIG. 3.

A preferred embodiment of part C is illustrated in FIG. 5. The output frequency of oscillator 2 (FIG. 1) is applied, via lead 431, to an input of a logic subtracter 3524, through a frequency divider by 100 (3526). The other input of subtracter 3524 receives the output frequency of oscillator 41, via lead 412 and a further frequency divider by 100 (3523). Subtracter 3524, which is for instance model MC 12000 of Motorola, will provide at its output the difference between the output frequencies of respective oscillators 41 and 2, divided by 100. The said difference is compared, in a frequency and phase comparator 3525, to the output frequency of oscillator 31, applied via 312 and a further frequency divider by 100. In practice, divider 3520 of FIG. 4 will be used. The output of comparator 3525 controls, through lead 411, the frequency of oscillator 41, which will thus be the algebraic sum of the output frequencies of oscillators 2 and 31.

The output frequency of oscillator 41 is finally variable from 320 to 640 MHz in steps of 1 kHz. This frequency is transmitted directly to output amplifier 45 of the generator when switch 46 is closed. When only a second switch 47 is closed, it is transmitted after division by a binary divider 48. When only a third switch 49 is closed, it is transmitted after division by binary dividers 48 and 50. The range from 80 to 320 MHz is thus covered.

To cover the range from 0 to 80 MHz, the frequency of 400 MHz obtained at the output of filter 35 when the latter is suitably tuned, is applied to a mixer 51, which receives the range from 320 to 640 MHz when switch 46 is closed. Mixer 50 is followed by a low-pass filter 52 having a cut off frequency of 80 MHz. The beat between the frequency of 400 MHz and the portion of range from 400 to 480 MHz is applied to amplifier 45 when change-over switch 53 is in the position shown in dots.

An amplitude modulator 54, actuated by a low frequency voltage applied to a potentiometer 55 regulating the degree of modulation is intercalated into the connection between oscillator 41 and amplifier 45. The latter has a pass-band going from 300 kHz to 640 MHz.

It goes without saying that the frequency plan adopted, which is particularly useful for making a generator, may undergo modifications without departing from the spirit of the invention.

We claim:

1. Frequency synthesizer apparatus including in combination: a voltage controlled oscillator having an output and a control input; a source of standard frequency signal; first harmonic generating means coupled to the said source for producing a plurality of harmonics of the standard frequency signal, the highest frequency of said harmonics not exceeding ten times the standard frequency; first subtractive mixer means coupled to the said first harmonic generating means and to the output of the voltage controlled oscillator, said first subtractive mixer means having an output; second subtractive mixer means having a first input connected to the output of said first subtractive mixer means, a second input and an output, the output of the second mixer means being connected to the control input of the voltage controlled oscillator; a frequency divider having a division ratio lower that ten, an input coupled to the said source and an output; and second harmonic generating means connecting the output of the frequency divider to the second input of the second mixer means.

2. Frequency synthesizer apparatus according to claim 1, wherein the source supplies a standard frequency of 80 MHz and the divider has a division ratio equal to 8.

3. Frequency synthesizer apparatus according to claim 2, wherein the voltage controlled oscillator covers the range from 300 to 610 MHz; the apparatus further comprising a pass-band filter connecting the first harmonic generating means to the first subtractive mixer means; means for tuning the said pass-band filter to 320, 400, 480 and 560 MHz; and a low-pass filter having a cut-off frequency of 50 MHz and connecting the output of the first subtractive mixer means to the first input of the second subtractive mixer means.

4. Frequency synthesizer apparatus according to claim 1, said apparatus further comprising: a further voltage-controlled oscillator having an output and a control input; third subtractive mixer means having first and second inputs respectively connected to the outputs of the voltage controlled oscillator and of the further voltage controlled oscillator, said third subtractive mixer means having an output; fourth subtractive mixer means having a first input coupled to the output of said third subtractive mixer means, an output connected to the control input of the further voltage controlled oscillator and a second input; and frequency synthesizer means arranged for generating a frequency which is variable in steps smaller than the frequency steps of variation produced at the output of the said voltage controlled oscillator, said frequency synthesizer means being connected to the second input of the fourth mixer means.

5. Frequency synthesizer apparatus according to claim 3, said apparatus further comprising: a further voltage controlled oscillator having an output and a control input; third subtractive mixer means having first and second inputs respectively connected to the outputs of the voltage controlled oscillator and of the further voltage controlled oscillator, said third subtractive mixer means having an output; fourth subtractive mixer means having a first input coupled to the output of said third subtractive mixer means, an output connected to the control input of the further voltage controlled oscillator and a second input; and frequency synthesizer means connected to the second input of the fourth mixer means, said frequency synthesizer means generating a frequency which is variable between 20 and 30 MHz in steps of 1 kHz and the further voltage controlled oscillator covering the range from 320 to 640 MHz.

* * * * *